(12) United States Patent
Brandonisio

(10) Patent No.: US 11,705,912 B2
(45) Date of Patent: Jul. 18, 2023

(54) DIGITAL PHASE LOCKED LOOP TRACKING

(71) Applicant: Infineon Technologies AG, Neubiberg (DE)

(72) Inventor: Francesco Brandonisio, Villach (AT)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 17/386,774

(22) Filed: Jul. 28, 2021

(65) Prior Publication Data

US 2021/0359691 A1    Nov. 18, 2021

Related U.S. Application Data

(63) Continuation of application No. 16/384,374, filed on Apr. 15, 2019, now Pat. No. 11,133,808.

(51) Int. Cl.
| | |
|---|---|
| *H03L 7/099* | (2006.01) |
| *H03L 7/093* | (2006.01) |
| *H03L 1/02* | (2006.01) |
| *G05B 13/04* | (2006.01) |
| *H03L 1/00* | (2006.01) |

(52) U.S. Cl.
CPC .......... *H03L 7/0991* (2013.01); *G05B 13/042* (2013.01); *H03L 1/00* (2013.01); *H03L 1/02* (2013.01); *H03L 7/093* (2013.01); *H03L 2207/50* (2013.01)

(58) Field of Classification Search
CPC ....... H03L 7/093; H03L 7/099; H03L 7/0991; H03L 7/0992; H03L 7/0993; H03L 2207/50; H03L 1/00; H03L 1/02; G05B 13/04; G05B 13/042; G05B 13/044; G05B 13/045
See application file for complete search history.

(56) References Cited

U.S. PATENT DOCUMENTS

2003/0094982 A1    5/2003 Zampetti et al.

*Primary Examiner* — Diana J. Cheng
(74) *Attorney, Agent, or Firm* — Banner & Witcoff Ltd.

(57) ABSTRACT

A tracking system for a digital Phase Locked Loop (PLL), the tracking system including a PLL model configured to emulate an actual internal PLL signal, wherein the emulation is based on another internal PLL signal received from the digital PLL and on an estimated analog PLL parameter of the PLL model; and a tracker configured to compare the emulated internal PLL signal with the actual internal PLL signal, and to update the estimated analog PLL parameter according to a minimization algorithm that minimizes a result of the comparison.

20 Claims, 9 Drawing Sheets

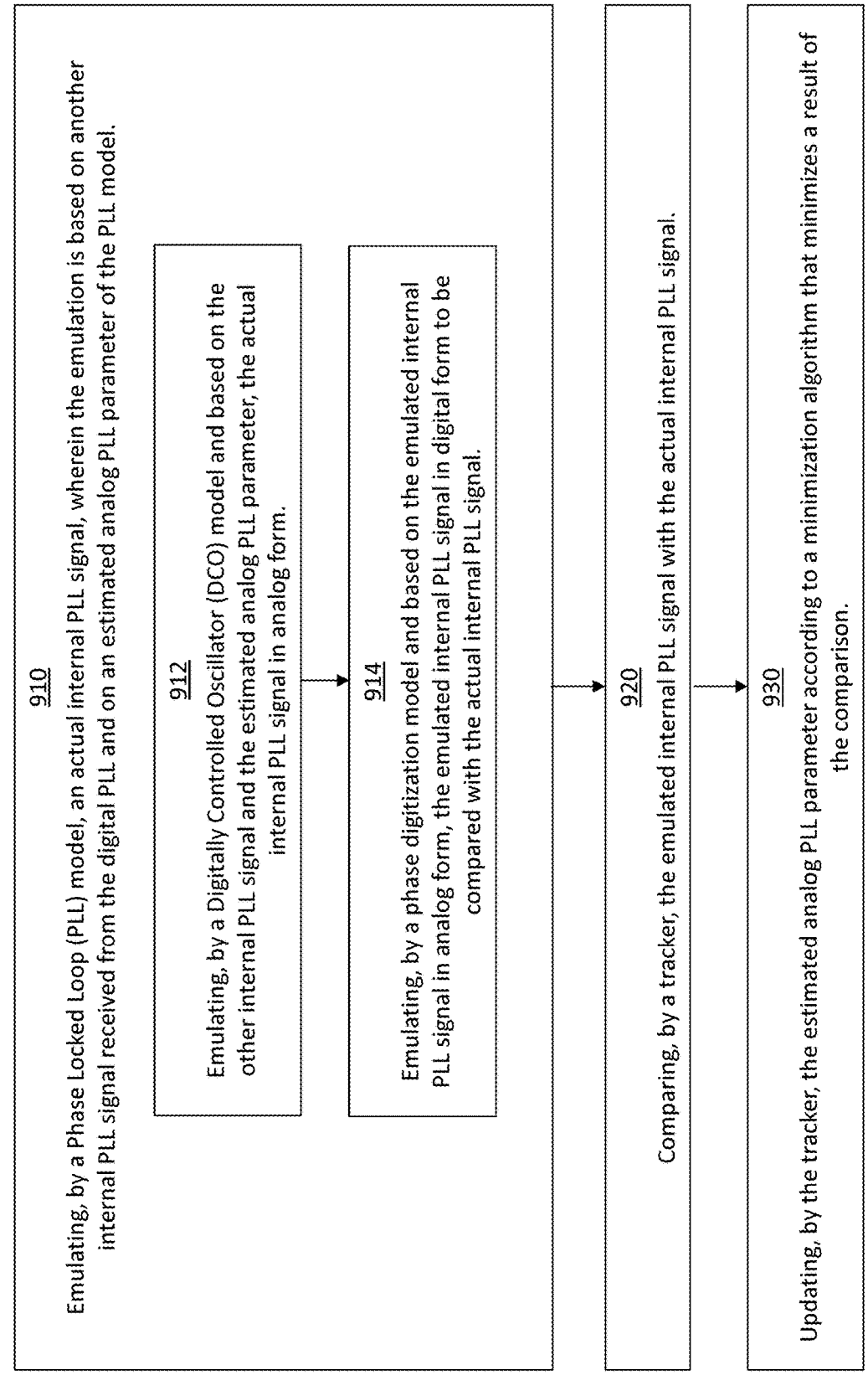

DIGITAL PHASE LOCKED LOOP TRACKING

BACKGROUND

Analog parameters in circuits are affected by Process, Voltage, and Temperature (PVT) variations. Tracking analog parameter variations enables better performance via calibration. Calibration is more important in smaller technology nodes where the impact of the PVT variations is more significant.

Phase Locked Loops (PLL) traditionally use correlators to track analog parameters. A correlator is advantageous due to its low complexity, and being a first order system, inherent stability. However, correlators estimate close to actual analog parameter values only on average, even after the correlator has reached steady state. Moreover, the estimation is relatively slow, requires a signal injection, and is specific for gains.

BRIEF DESCRIPTION OF THE DRAWINGS

FIG. 9 illustrates a flowchart of a tracking method for a digital PLL in accordance with aspects of the disclosure.

DETAILED DESCRIPTION

The present disclosure is directed to a tracking system for a digital Phase Locked Loop (PLL) that replaces a correlator. The system has a PLL model and a tracker, wherein the tracker continuously compares the PLL model with the actual digital PLL, and based on this comparison, updates analog parameters of the PLL model.

Figure 1:
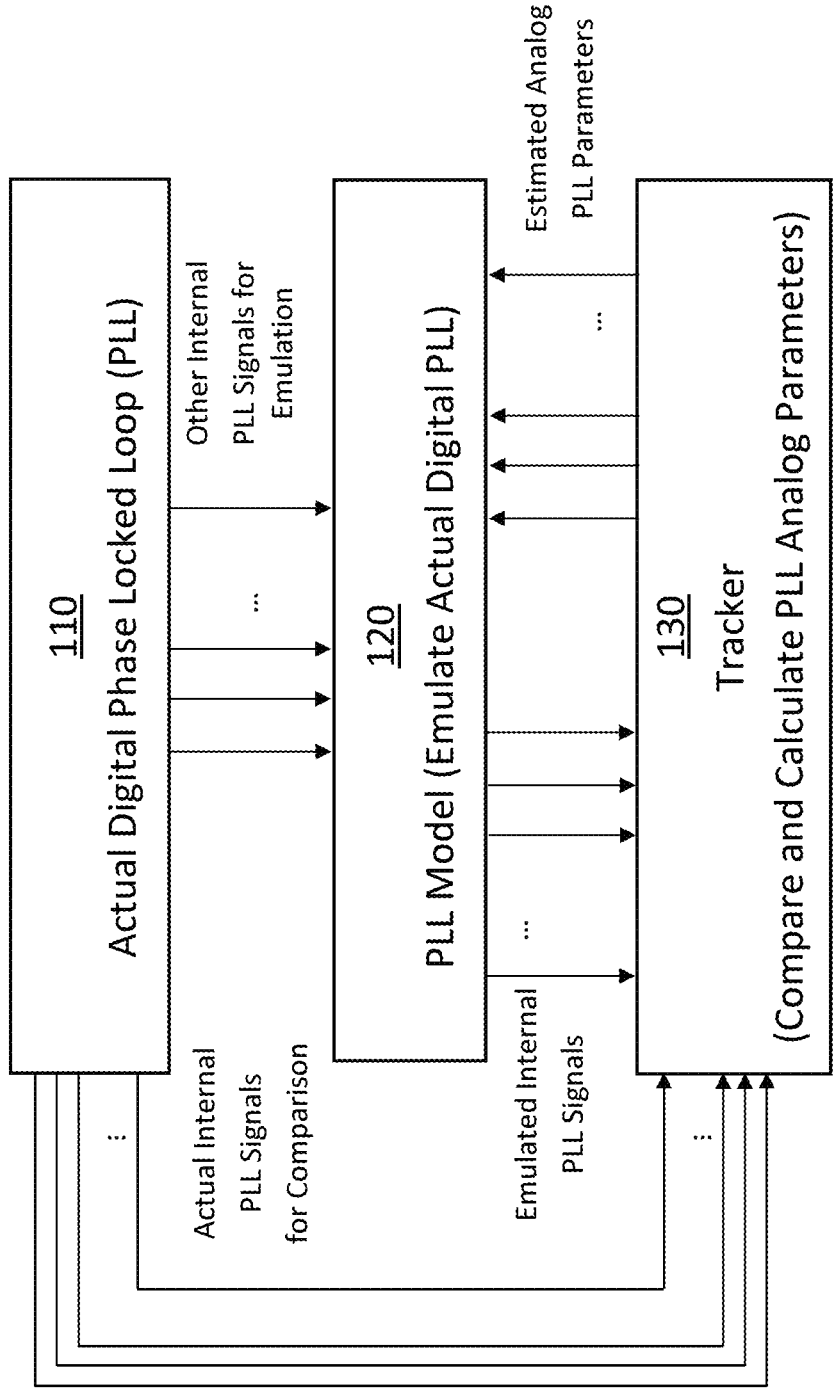
FIG. 1 illustrates a tracking system for a digital Phase Locked Loop (PLL) in accordance with aspects of the disclosure.

FIG. 1 illustrates a tracking system 100 for a digital Phase Locked Loop (PLL) in accordance with aspects of the disclosure.

The tracking system 100 comprises an actual digital Phase Locked Loop (PLL) 110, a PLL model 120, and a tracker 130.

The digital PLL 110 is configured to generate an output signal whose phase is related to a phase of an input signal. PLLs are known, but relevant details are described further below with respect to FIGS. 2A and 2B.

The PLL model 120 is configured to emulate one or more actual internal PLL signals. This emulation is based on one or more other internal PLL signals received from the digital PLL 110 and on an estimated analog PLL parameter of the PLL model 120 received from the tracker 130. In the figure, the signals labelled "emulated internal PLL signals" are close to those labelled "actual internal PLL signals for comparison" when the PLL model 120 represents well the operations of the actual digital PLL 110. The estimated analog PLL parameter may be, for example, one or more of Digitally Controlled Oscillator (DCO) gain, DCO offset, phase digitization gain, phase digitization offset, Differential Nonlinearity (DNL) errors in a DCO, Integral Nonlinearity (INL) errors in a DCO, DNL errors in the phase digitization, INL errors in the phase digitization, and PLL bandwidth.

The tracker 130 is configured to compare one or more emulated internal PLL signals with the one or more actual internal PLL signals received from the actual PLL 110. The tracker 130 is also configured to update the estimated analog PLL parameter according to a minimization algorithm that minimizes a result of the comparison. The tracker 130 transmits the updated estimated analog PLL parameter to the PLL Model 120.

Figure 2A:
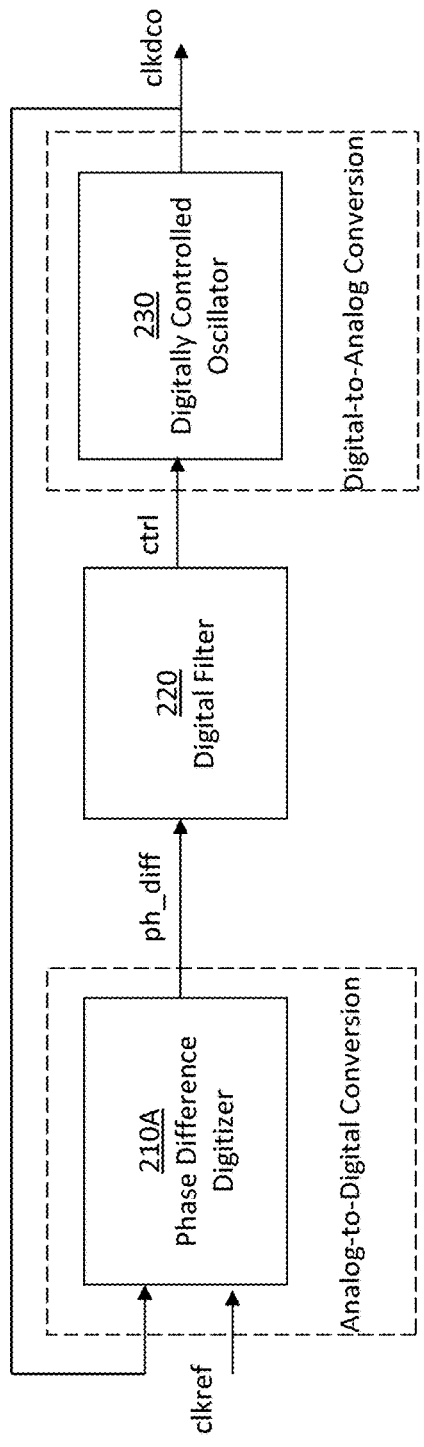
FIGS. 2A and 2B illustrate exemplary details of a digital PLL.
Figure 2B:
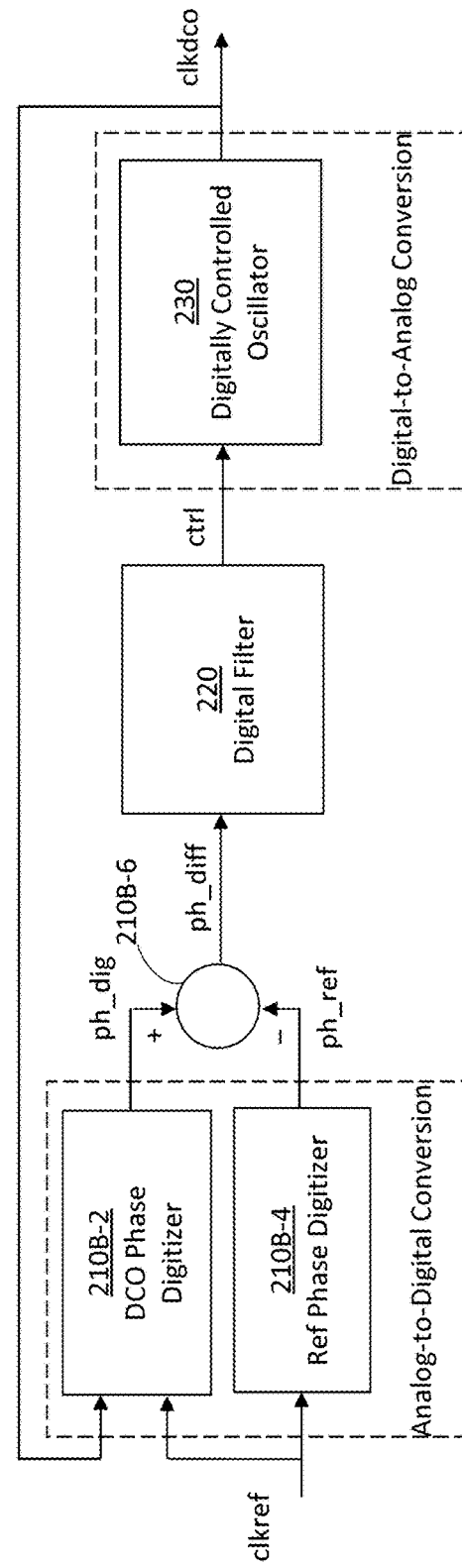

FIGS. 2A and 2B illustrate exemplary details of a digital PLL 200 (200A and 200B), such as the digital PLL 110 of FIG. 1. These PLLs 200 are merely examples and the disclosure is not limited thereto.

FIG. 2A illustrates a digital PLL 200A, which is a feedback loop comprising a phase difference digitizer 210, a digital filter 220, and a DCO 230. FIG. 2B illustrates a PLL 200B, which is similar to the PLL 200A of FIG. 2A, except that the phase difference digitizer 210A is replaced with a combination of a DCO phase digitizer 210B-2, a reference phase digitizer, and a subtractor 210B-6; alternatively, the DCO could be replaced with a Voltage Controlled Oscillator (VCO).

The digital PLL 200 is configured to regulate and process a phase difference ph_diff between two signals, namely a reference clock signal clkref and a DCO signal clkdco. More specifically, the DCO 230 generates a periodic signal clkdco, and the phase difference digitizer 210A compares the phase of this periodic signal clkdco with the phase of the input periodic signal clkref, adjusting the DCO 230 to keep the phases matched.

Phase and frequency are inherently analog quantities that are digitized in the digital PLL 200. In particular, the digital PLL 200 is based on the digitization of the phase difference ph_diff between two signals, as shown in FIG. 2A, or on the direct digitization of phases of two signals, as shown in FIG. 2B. Thus the phase difference digitizer 210 is essentially an analog-to-digital converter. The DCO 230 is essentially a digital-to-analog converter. Analog parameters associated with the analog-to-digital and digital-to-analog conversions include gain, offset, quantization steps, DNL errors, and INL errors. There are thus at least two gains—one gain in the analog-to-digital conversion and another in the digital-to-analog conversion. These gains might change with PVT, and gain changes may be tracked by the tracker 130.

The digital filter 220 filters in accordance with discrete time equations describing discrete time Finite Impulse Response (FIR) or Infinite Impulse Response (IIR) digital filters. In particular, IIR loop filters are typical in digital PLLs. A simple model of an IIR filter is in the form of $y[n]=A0 \cdot x[n]+A1 \cdot x[n-1]+A2 \cdot x[n-2]+A3 \cdot x[n-3]+ \ldots +B1 \cdot y[n-1]+B2 \cdot y[n-2]+B3 \cdot y[n-3]+ \ldots$, where y[n] and x[n] are the output and input of the digital filter at the discrete instant n, respectively. The output ctrl of the digital filter 220 is then input to the DCO 230.

The PLL model 120 and the tracker 130 may be fully digital when the one or more observed internal PLL signals are fully digital. A fully digital PLL model 120 and tracker 130 is attractive for portability, simplicity of testing, scalability with technology, and robustness. The actual PLL is partially analog, for example, the DCO oscillator 230 may be mixed signal.

Figure 3:
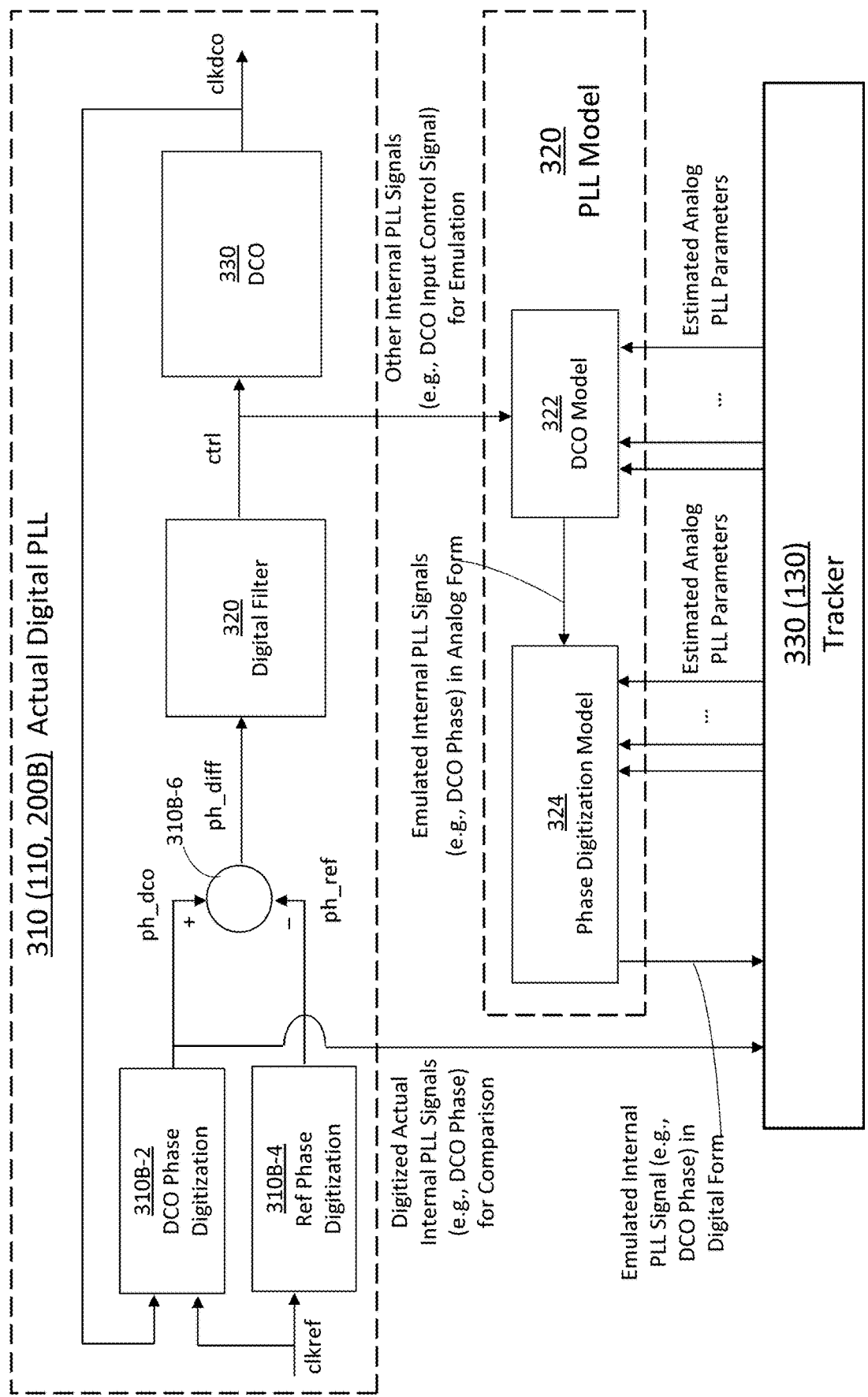
FIG. 3 illustrates a tracking system for a digital PLL in accordance with aspects of the disclosure.

FIG. 3 illustrates a tracking system 300 for a digital PLL in accordance with aspects of the disclosure.

The tracking system 300 comprises an actual digital PLL 310, a PLL model 320, and a tracker 330. The actual digital PPL in this particular example is the PLL 200B of FIG. 2B, though the disclosure is not limited in this respect. Similar elements corresponding with those of previous figures have similar reference numbers but with the initial digit changed to correspond with the figure number.

The PPL model 320 comprises a Digitally Controlled Oscillator (DCO) model 322 and a phase digitization model 324.

The DCO model 322 is configured to emulate, based on the other internal PLL signal ctrl and the estimated analog PLL parameter, the actual internal PLL signal in analog form. An example of the other internal PLL signal ctrl is a DCO input word (e.g., DCO input control signal), and the actual and emulated internal PLL signal is DCO phase.

The phase digitization model 324 is configured to emulate, based on the emulated internal PLL signal in analog form (e.g., emulated analog DCO phase) and an estimated analog PLL parameter, the emulated internal PLL signal in digital form (e.g., emulated digital DCO phase) to be compared with the actual internal PLL signal ph_dco (actual digital DCO phase).

The PLL model 320 may be closed loop or open loop, and may be based on discrete time equations that describe the DCO digital-to-frequency model characteristic and the phase-to-digital characteristic of phase digitization model circuitry. An example model for a DCO is the equation fDCO=kdco·in +f0, where fDCO, kdco, in and f0 are the DCO frequency, DCO gain, input signal, and offset frequency, respectively.

Figure 4:
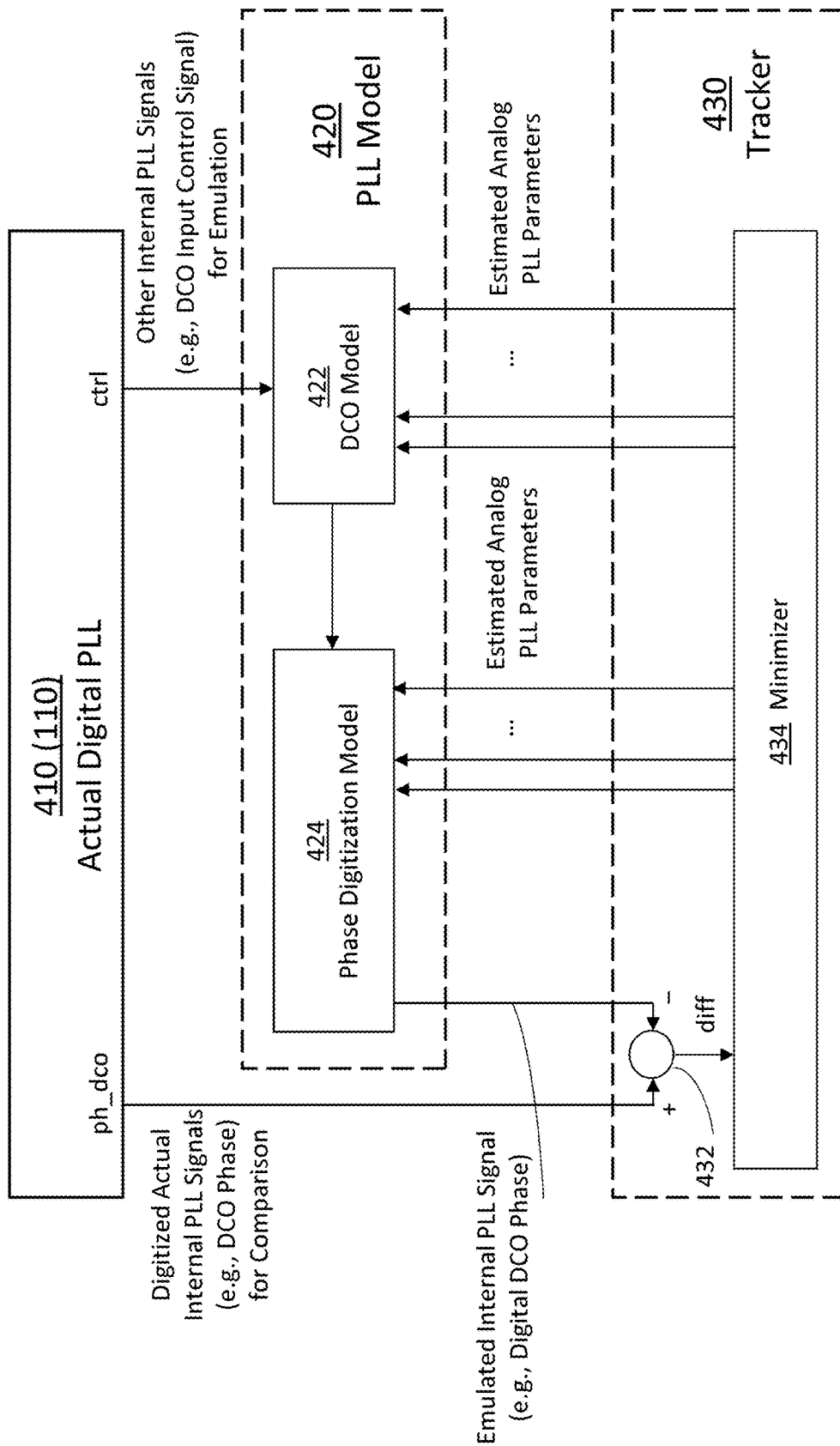
FIG. 4 illustrates another tracking system for a digital PLL in accordance with aspects of the disclosure.

FIG. 4 illustrates another tracking system 400 for a digital PLL 410 in accordance with aspects of the disclosure.

By way of overview, the tracking system 400 is similar to the tracking system 300 of FIG. 3, except with the comparison between the emulated and actual internal PLL signal (e.g., digital DCO phase) implemented by a simple difference. The difference signal diff is fed to a minimizer 434 configured to perform a minimization algorithm and updates the parameters of the DCO model 422 and the phase digitization model 424.

The tracking system 400 comprises an actual digital PLL 410, a PLL model 420, and a tracker 430. Similar elements corresponding with those of previous figures have similar reference numerals, but with the initial digit changed to correspond with the figure number.

The tracker 430 comprises a subtractor 432 and a minimizer 434. The subtractor 432 is configured to perform the comparison by subtracting the emulated internal PLL signal (e.g., emulated digital DCO phase) from the actual internal PLL signal (e.g., actual digital DCO phase). The subtractor 432 is then configured to feed the subtraction result signal diff to the minimizer 434 which performs the minimization algorithm 434. The minimization algorithm updates the estimated analog PLL parameters sent to the PLL model 420 until the difference signal diff is zero.

The minimization algorithm 432 may be, for example, a Least Mean Squares (LMS) algorithm, a Particle Swarm Optimization (PSO) algorithm, a Random Walk Optimization (RWO) algorithm, a Neural-Network (NN)-based algorithm, or an algorithm of scaling and accumulating a difference between the emulated PLL signal and the actual internal PLL signal.

Instead of the subtractor 432 determining a simple difference, the comparison may alternatively be implemented as a cost function defined by a combination of features extracted from the digitized actual PLL signal (e.g., digitized actual DCO phase) and the emulated internal PLL signal (e.g., digitized emulated DCO phase). The cost function circuit is configured to perform the comparison by determining a cost function based on the emulated internal PLL signal and the actual internal PLL signal, and then feed the determined cost function to the minimization algorithm. The minimization algorithm minimizes the aforementioned simple difference or the more general cost function.

Figure 5:
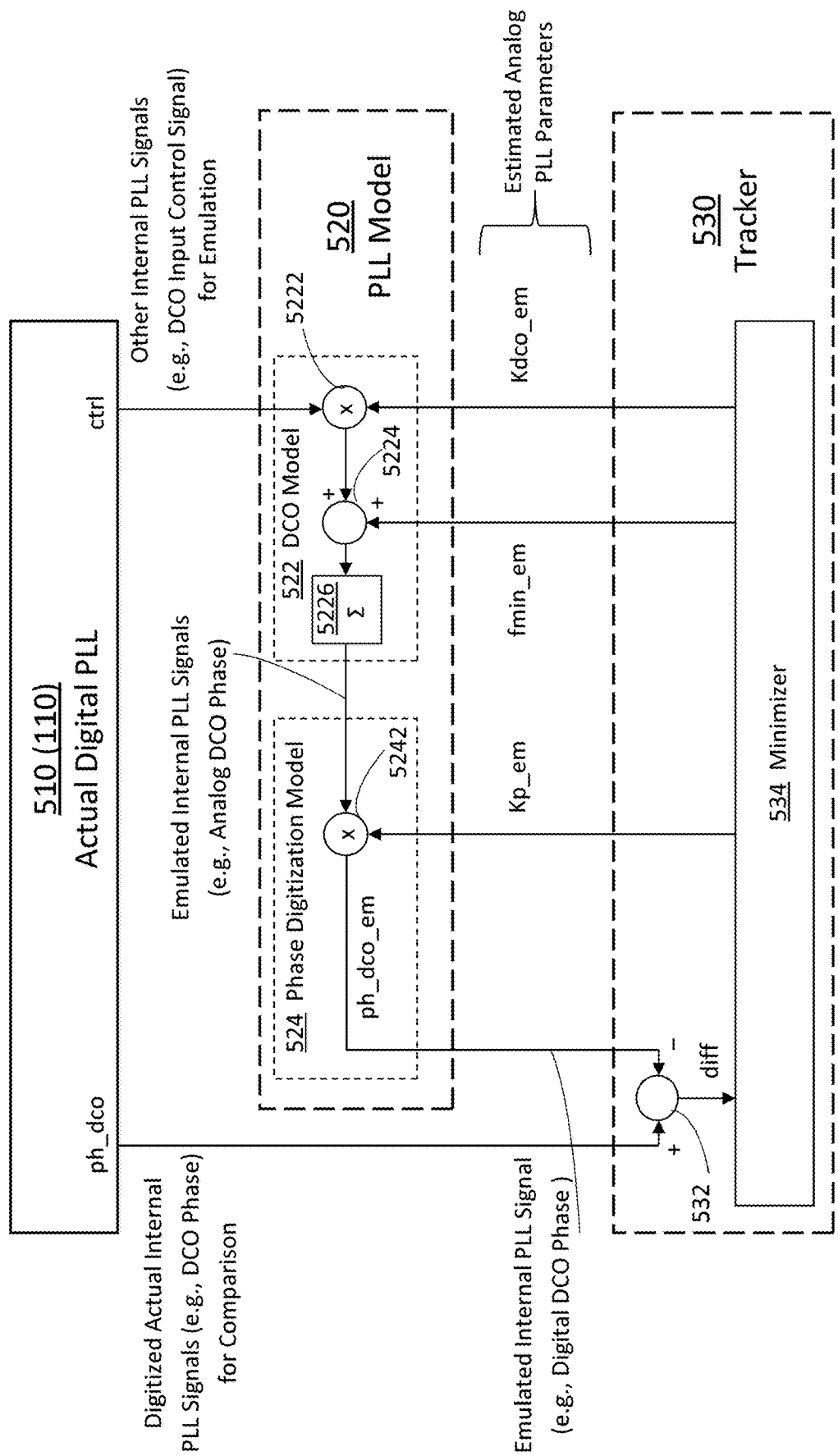
FIG. 5 illustrates another tracking system for a digital PLL in accordance with aspects of the disclosure.

FIG. 5 illustrates another tracking system 500 for a digital PLL in accordance with aspects of the disclosure.

By way of overview, the tracking system 500 is similar to the tracking system 400 of FIG. 4, but additional including exemplary details of DCO model 522 and phase digitization model 524.

The tracking system 500 comprises an actual digital PLL 510, a PLL model 520, and a tracker 530. Similar elements corresponding with those of previous figures have similar reference numerals, but with the initial digit changed to correspond with the figure number.

The system 500 may comprise a plurality of estimated analog PLL parameters, such as estimated DCO gain K_dco_em, estimated DCO minimum frequency fmin_em, and estimated phase digitization gain Kp_em. The internal PLL signal may be a DCO input control signal ctrl, such as a DCO input word. The actual internal PLL signal may be a DCO phase signal.

The DCO model 522 is configured to emulate a DCO phase signal in analog form based on the DCO input control signal ctrl, the estimated DCO gain Kdco_em, and the estimated DCO minimum frequency fmin_em.

The DCO model 522 comprises a multiplier 5222, an adder 5224, and a frequency-to-phase converter 5226. The multiplier 5222 is configured to multiply the DCO input control signal ctrl, which is the other internal PLL signal, with the estimated DCO gain Kdco_em, which is the estimated analog PLL parameter. The adder 5224 is configured to add the multiplication result to the estimated DCO minimum frequency fmin_em, which is another estimated analog PLL parameter of the PLL model 520, and output an emulated DCO frequency signal. The frequency-to-phase converter 5226 is configured to convert the emulated DCO frequency signal into the emulated DCO phase signal in analog form.

The phase digitization model 524 is configured to emulate the DCO phase signal in digital form ph_dco_em based on the emulated DCO phase signal in analog form (from the DCO model 522) and the estimated phase digitization gain Kp_em. More specifically, the phase digitization model 524 comprises a second multiplier 5242, which is configured to multiply the emulated DCO phase signal in analog form (from the frequency-to-phase converter 5226 of the DCO model 522) and the estimated phase digitization gain Kp_em, which is yet another estimated analog PLL parameter of the PLL model 520, and output the emulated DCO phase signal ph_dco_em in digital form, which is the emulated internal PLL signal to be compared with the actual internal PLL signal.

Figure 6:
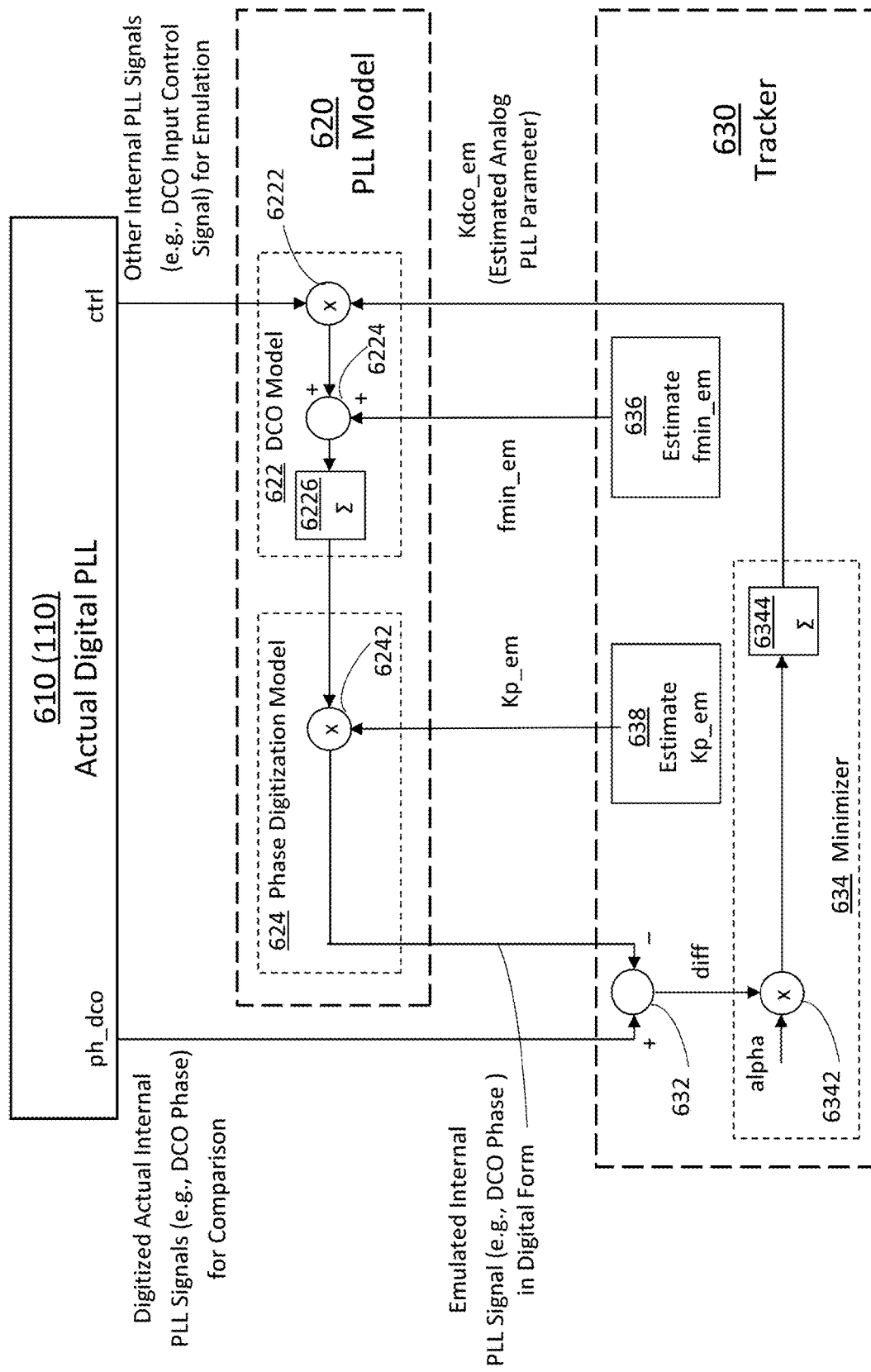
FIG. 6 illustrates another tracking system for a digital PLL in accordance with aspects of the disclosure.

FIG. 6 illustrates another tracking system 600 for a digital PLL in accordance with aspects of the disclosure.

By way of overview, the tracking system 600 is similar to the tracking system 500 of FIG. 5, but with an exemplary minimizer 634 based on scaling and accumulating the difference signal diff. Also, an estimated analog PLL parameter may be predetermined.

The tracking system 600 comprises an actual digital PLL 610, a PLL model 620, and a tracker 630. Similar elements corresponding with those of previous figures have similar reference numerals, but with the initial digit changed to correspond with the figure number.

The PLL model 620 is configured to emulate the actual internal PLL signal based on a plurality of other internal PLL signals received from the digital PLL 610. At least one of the plurality of estimated analog PLL parameters may be predetermined. In this example, predetermined estimated analog PLL parameters are DCO minimum frequency fmin_em and phase digitization gain Kp_em. At least one of the plurality of estimated analog PLL parameters is updated continuously during tracking system operation; in this example DCO gain Kdco_em.

The blocks labeled "estimate fmin_em" 636 and "estimate Kp_em" 638 represent circuitry that produces emulated versions of the DCO minimum frequency fmin_em and the phase digitization gain Kp_em, respectively. The circuitry may be based on gains and accumulators, such as a minimization algorithm. In a simple scenario, the circuitry sets the phase digitization gain Kp_em and DCO minimum frequency signal fmin_em to pre-programmed constant values estimated a priori via simulations.

The tracker 630 comprises a minimizer 634 configured to minimize the difference signal diff and track the DCO gain Kdco. The minimizer 634 comprises a scalar (multiplier) 6342 and an accumulator 6344. The scalar 6342 configured to multiply the difference signal diff with a coefficient alpha. The accumulator 6344 is configured to accumulate the scaled difference between the emulated DCO gain signal Kdco_em and the actual DCO gain signal Kdco. The emulated DCO gain signal Kdco_em is close to the actual DCO gain signal Kdco when the tracking system 600 has reached steady state.

Figure 7:
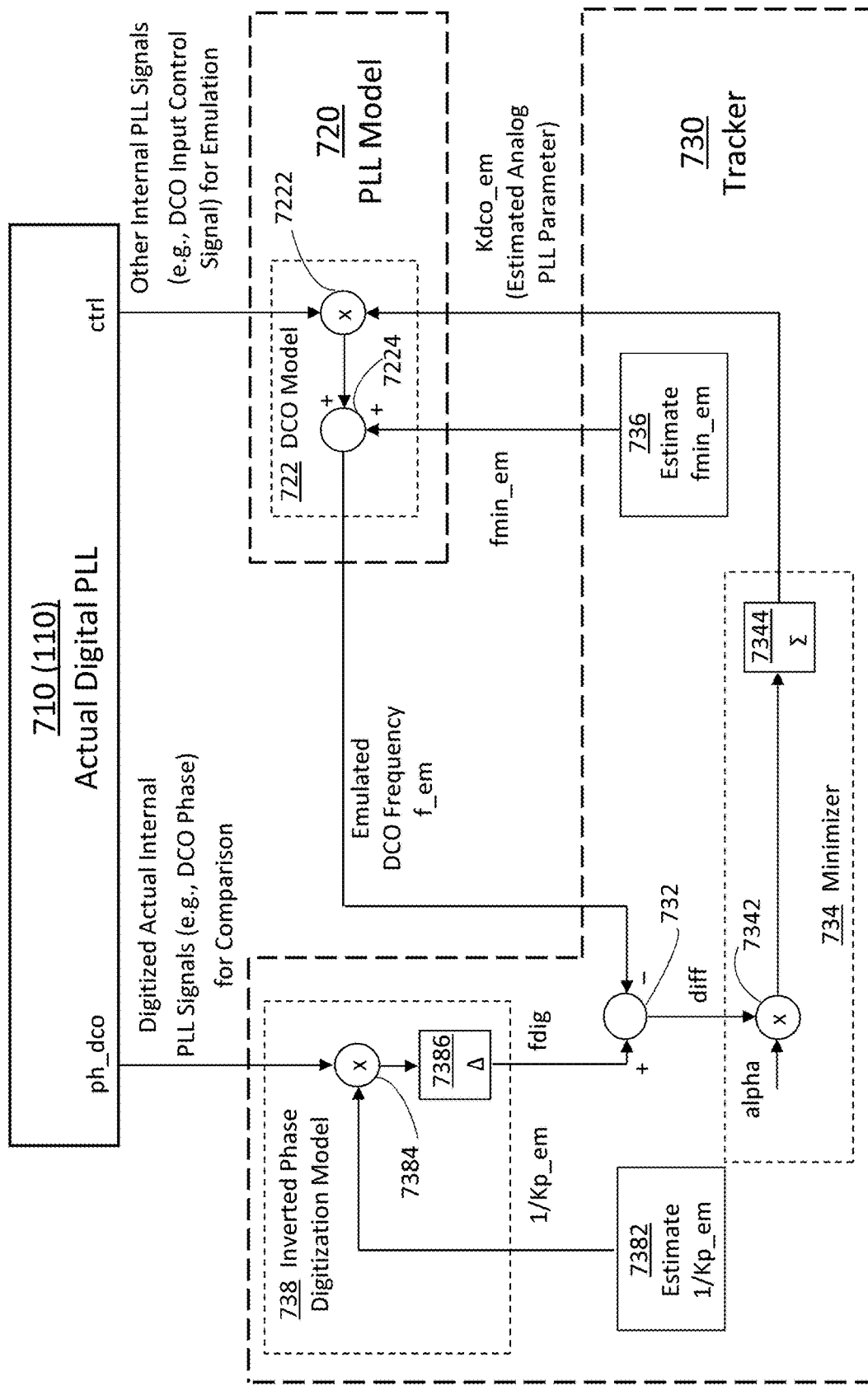
FIG. 7 illustrates another tracking system for a digital PLL in accordance with aspects of the disclosure.

FIG. 7 illustrates another tracking system 700 for a digital PLL 710 in accordance with aspects of the disclosure.

By way of overview, the tracking system 700 is similar to the tracking system 600 of FIG. 6, but the PLL model 720 is reduced to the DCO model 722 only. A portion of the PLL model 720, namely the inverted phase digitization model 738, is included inside the tracker 730. The tracking system 700 demonstrates that portions of the PLL model 720 may be merged with the tracker 730.

The tracking system 700 comprises an actual digital PLL 710, a PLL model 720, and a tracker 730. Similar elements corresponding with those of previous figures have similar reference numerals, but with the initial digit changed to correspond with the figure number.

The PLL model 720 comprises a first PLL model portion 722, which in this case is a DCO model. The DCO model is configured to emulate a first actual internal PLL signal (e.g., emulated DCO frequency f_em). This emulation is based on a first other internal PLL signal (e.g., DCO input control signal ctrl) received from the digital PLL 710, and on a first estimated analog PLL parameter of the PLL model (e.g., estimated DCO gain Kdco_em and DCO minimum frequency fmin_em 736).

The tracker 730 comprises a second PLL model portion 738, a comparator 732, and a minimizer 734.

The second PLL model portion 738 in this example is an "inverted" phase digitization model. The second PLL model portion 738 is configured to emulate a second actual internal signal (e.g., digitized DCO frequency fdig) based on a second other internal PLL signal (e.g., DCO phase ph_dco) received from the digital PLL 710 and an inverted second estimated analog PLL parameter 7382 (e.g., inverted estimated phase digitization gain 1/Kp_em).

The comparator 732 is configured to compare the first emulated actual internal PLL signal (e.g., DCO frequency f_em) with the second emulated actual internal PLL signal (e.g., digitized DCO frequency fdig) and output a difference signal diff The minimizer 734 is configured to minimize a result of the comparison, that is, the difference signal diff. The minimizer 734 is also configured to update the estimated analog PLL parameter (e.g., estimated DCO gain Kdco_em) based on the minimized result.

Figure 8B:
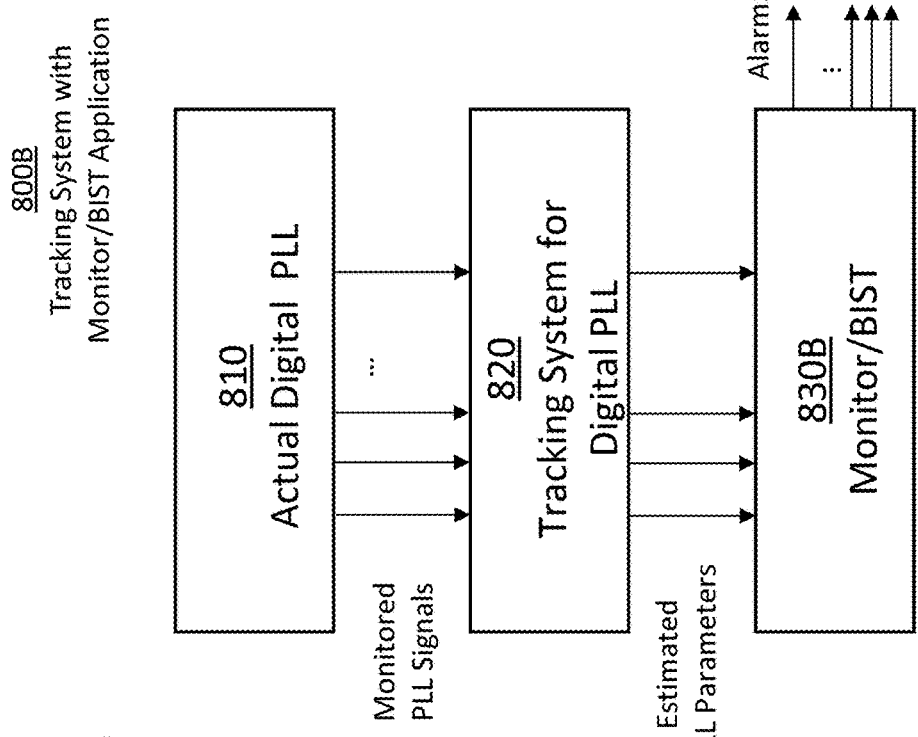
FIG. 8B illustrates a tracking system with monitoring/Built-In-Self-Test (BIST) application for a digital PLL in accordance with aspects of the disclosure.
Figure 8A:
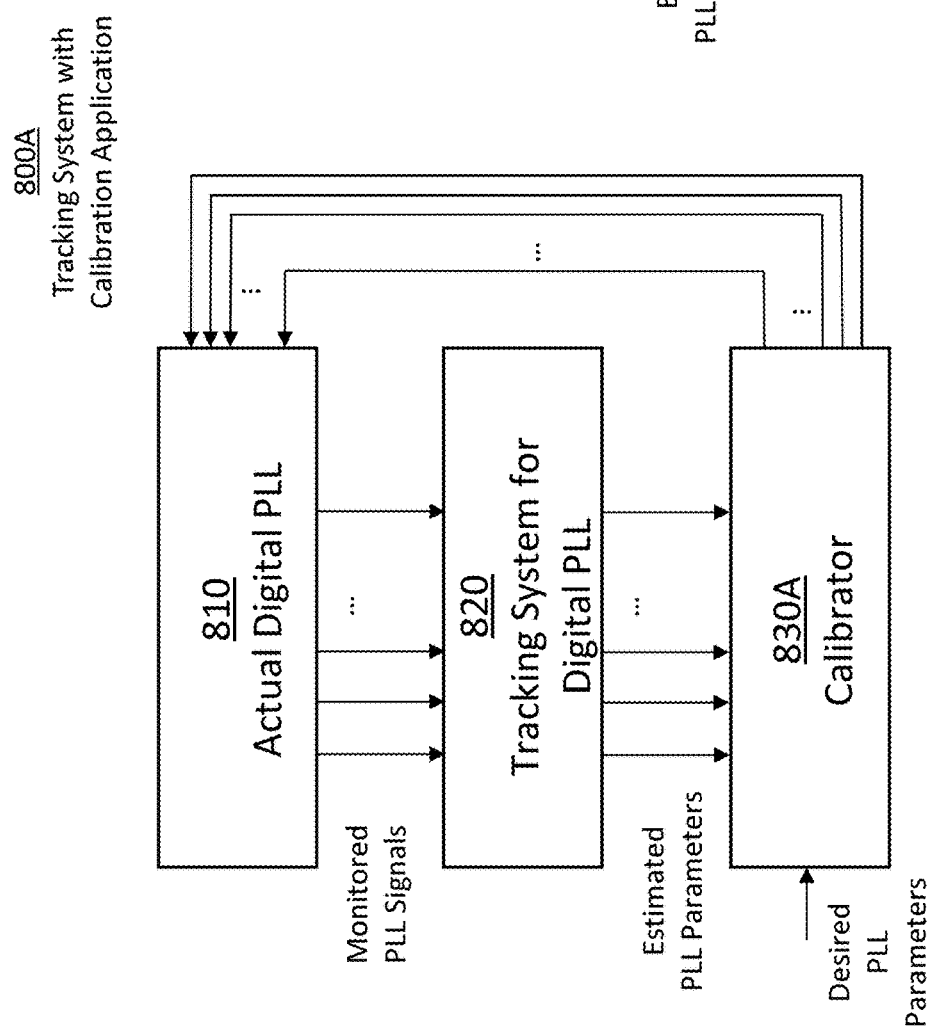
FIG. 8A illustrates a tracking system with calibration application for a digital PLL in accordance with aspects of the disclosure.

FIG. 8A illustrates a tracking system with calibration application 800A in accordance with aspects of the disclosure.

The system 800A comprises an actual digital PLL 810, a tracking system 820, and a calibrator 830A. The actual digital PLL 810 and the tracking system 820 may be any of the tracking systems 100/300/400/500/600/700 described herein.

The calibrator 830A is configured to calibrate the actual digital PLL 810 based on the estimated analog PLL parameter and a corresponding desired analog PLL parameter, as described above. In other words, the calibrator 830A may perform a background calibration within the digital PLL 810 of an analog PLL parameter, such as DCO gain. This calibration may be performed during production or in the field.

FIG. 8B illustrates a tracking system with monitoring/Built-In-Self-Test (BIST) application 800B in accordance with aspects of the disclosure.

The system 800B is similar to the system 800A of FIG. 8A, except that rather than a calibrator 830, there is a monitor or Built-In-Self-Test (BIST) 830B.

The monitor or Built-In-Self-Test (BIST) 830B is configured to generate an alarm signal when the estimated analog PLL parameter is outside of a predetermined range. When select samples do not meet the requirements in a production test, the monitor/BIST 830B may be configured to send an alarm to a system that includes the digital PLL 810 in order to indicate aging of the digital PLL 810. This test may be performed during production or in the field.

FIG. 9 illustrates a flowchart of a tracking method 900 for a digital PLL in accordance with aspects of the disclosure.

At Step 910, emulating, by a PLL model 120/320/420/520/620, an actual internal PLL signal. The emulation is based on another internal PLL signal received from the digital PLL 110/310/410/510/610 and on an estimated analog PLL parameter of the PLL model 120/420/520/620.

The emulating Step 910 comprises Steps 912 and 914. At Step 912, emulating, by a Digitally Controlled Oscillator (DCO) model 322/422/522/622 and based on the other internal PLL signal and the estimated analog PLL parameter, the actual internal PLL signal in analog form. At Step 914, emulating, by a phase digitization model 324/424/524/624 and based on the emulated internal PLL signal in analog form, the emulated internal PLL signal in digital form to be compared with the actual internal PLL signal.

At Step 920, comparing, by a tracker 130/330/430/530/630, the emulated internal PLL signal with the actual internal PLL signal.

At Step 930, updating, by the tracker 130/330/430/530/630, the estimated analog PLL parameter according to a minimization algorithm that minimizes a result of the comparison.

The tracking system of the present disclosure provides a valid analog parameter estimate at any time instant after convergence. The system, although more complex than a correlator, requires no injection and is potentially faster.

The techniques of this disclosure may also be described in the following examples.

Example 1. A tracking system for a digital Phase Locked Loop (PLL), the tracking system comprising: a PLL model configured to emulate an actual internal PLL signal, wherein the emulation is based on another internal PLL signal received from the digital PLL and on an estimated analog PLL parameter of the PLL model; and a tracker configured to compare the emulated internal PLL signal with the actual internal PLL signal, and to update the estimated analog PLL parameter according to a minimization algorithm that minimizes a result of the comparison.

Example 2. The tracking system of example 1, wherein the PLL model comprises: a Digitally Controlled Oscillator (DCO) model configured to emulate, based on the other internal PLL signal and the estimated analog PLL parameter, the actual internal PLL signal in analog form; and a phase digitization model configured to emulate, based on the emulated internal PLL signal in analog form, the emulated internal PLL signal in digital form to be compared with the actual internal PLL signal.

Example 3. The tracking system of any combination of examples 1 and 2: wherein the system comprises a plurality of estimated analog PLL parameters including estimated DCO gain, estimated DCO minimum frequency, and estimated phase digitization gain, the internal PLL signal is a DCO input control signal, and the actual internal PLL signal is a DCO phase signal, wherein the DCO model is configured to emulate a DCO phase signal in analog form based on the DCO input control signal, the estimated DCO gain, and the estimated DCO minimum frequency, and wherein the phase digitization model is configured to emulate the DCO phase signal in digital form based on the emulated DCO phase signal in analog form and the estimated phase digitization gain.

Example 4. The tracking system of any combination of examples 1-3, wherein the PLL model is configured to emulate the actual internal PLL signal based on a plurality of estimated analog PLL parameters of the PLL model, at least one of the plurality of estimated analog PLL parameters being predetermined, and at least one of the plurality of estimated analog PLL parameters being updated continuously during tracking system operation.

Example 5. The tracking system of any combination of examples 1-4, wherein the PLL model comprises a Digitally Controlled Oscillator (DCO) model comprising: a multiplier configured to multiply a DCO input control signal, which is the other internal PLL signal, with an estimated DCO gain, which is the estimated analog PLL parameter; and an adder configured to add the multiplication result to an estimated DCO minimum frequency, which is another estimated analog PLL parameter of the PLL model, and output an emulated DCO frequency signal.

Example 6. The tracking system of any combination of examples 1-5, wherein the DCO model further comprises: a frequency-to-phase converter configured to convert the emulated DCO frequency signal into the emulated DCO phase signal in analog form.

Example 7. The tracking system of any combination of examples 1-6, wherein the PLL model further comprises a phase digitization model comprising: a second multiplier configured to multiply the emulated DCO phase signal in analog form and an estimated phase digitization gain, which is yet another estimated analog PLL parameter of the PLL model, and output the emulated DCO phase signal in digital form, which is the emulated internal PLL signal to be compared with the actual internal PLL signal.

Example 8. The tracking system of any combination of examples 1-7, wherein the estimated analog PLL parameter is Digitally Controlled Oscillator (DCO) gain.

Example 9. The tracking system of any combination of examples 1-8, wherein the estimated analog PLL parameter is phase digitization gain.

Example 10. The tracking system of any combination of examples 1-9, further comprising: a calibrator configured to calibrate the digital PLL based on the estimated analog PLL parameter and a corresponding desired analog PLL parameter.

Example 11. The tracking system of any combination of examples 1-10, further comprising: a monitor or Built-In-Self-Test (BIST) configured to generate an alarm signal when the estimated analog PLL parameter is outside of a predetermined range.

Example 12. The tracking system of any combination of examples 1-11, wherein the tracker comprises: a subtractor configured to perform the comparison by subtracting the emulated internal PLL signal from the actual internal PLL signal, and to feed the subtraction result signal to the minimization algorithm.

Example 13. The tracking system of any combination of examples 1-12, wherein the tracker comprises: a cost function circuit configured to perform the comparison by determining a cost function based on the emulated internal PLL signal and the actual internal PLL signal, and to feed the determined cost function to the minimization algorithm.

Example 14. The tracking system of any combination of examples 1-13, wherein the estimated PLL analog parameter is one or more of Digitally Controlled Oscillator (DCO) gain, DCO offset, phase digitization gain, phase digitization offset, Differential Nonlinearity (DNL) errors in a DCO, Integral Nonlinearity (INL) errors in the DCO, Differential Nonlinearity (DNL) errors in the phase digitization, Integral Nonlinearity (INL) errors in the phase digitization, and PLL bandwidth.

Example 15. The tracking system of any combination of examples 1-14, wherein each of the PLL model, the tracker, and the other internal PLL signal is fully digital.

Example 16. The tracking system of any combination of examples 1-15, wherein the minimization algorithm is a Least Mean Squares (LMS) algorithm, a Particle Swarm Optimization (PSO) algorithm, a Random Walk Optimization (RWO) algorithm, or an algorithm of scaling and accumulating a difference between the emulated PLL signal and the actual internal PLL signal.

Example 17. A tracking system for a digital Phase Locked Loop (PLL), the tracking system comprising: a PLL model comprising a first PLL model portion configured to emulate a first actual internal PLL signal, wherein the emulation is based on a first other internal PLL signal received from the digital PLL and on a first estimated analog PLL parameter of the PLL model; and a tracker comprising: a second PLL model portion configured to emulate a second actual internal signal based on a second other internal PLL signal received from the digital PLL and an inverted second estimated analog PLL parameter; a comparator configured to compare the first emulated actual internal PLL signal with the second emulated actual internal PLL signal; and a minimizer configured to minimize a result of the comparison, and update the first or second estimated analog PLL parameter based on the minimized result.

Example 18. A tracking method for a digital Phase Locked Loop (PLL), the method comprising: emulating, by a PLL model, an actual internal PLL signal, wherein the emulation is based on another internal PLL signal received from the digital PLL and on an estimated analog PLL parameter of the PLL model; comparing, by a tracker, the emulated internal PLL signal with the actual internal PLL signal; and updating, by the tracker, the estimated analog PLL parameter according to a minimization algorithm that minimizes a result of the comparison.

Example 19. The tracking method of example 18, wherein the emulating comprises: emulating, by a Digitally Controlled Oscillator (DCO) model and based on the other internal PLL signal and the estimated analog PLL parameter, the actual internal PLL signal in analog form; and emulating, by a phase digitization model and based on the emulated internal PLL signal in analog form, the emulated internal PLL signal in digital form to be compared with the actual internal PLL signal.

Example 20. The tracking method of any combination of examples 18 and 19: wherein there are a plurality of estimated analog PLL parameters including estimated DCO gain, estimated DCO minimum frequency, and estimated phase digitization gain, the internal PLL signal is a DCO input control signal, and the actual internal PLL signal is a DCO phase signal, wherein the emulating by the DCO model comprises emulating a DCO phase signal in analog form based on the DCO input control signal, the estimated DCO gain, and the estimated DCO minimum frequency, and wherein the emulating by the phase digitization model comprises emulating the DCO phase signal in digital form based on the emulated DCO phase signal in analog form and the estimated phase digitization gain.

While the foregoing has been described in conjunction with exemplary embodiment, it is understood that the term "exemplary" is merely meant as an example, rather than the best or optimal. Accordingly, the disclosure is intended to cover alternatives, modifications and equivalents, which may be included within the scope of the disclosure.

Although specific embodiments have been illustrated and described herein, it will be appreciated by those of ordinary skill in the art that a variety of alternate and/or equivalent implementations may be substituted for the specific embodiments shown and described without departing from the scope of the present disclosure. This disclosure is intended to cover any adaptations or variations of the specific embodiments discussed herein.

What is claimed is:

1. A tracking system for a digital Phase Locked Loop (PLL), the tracking system comprising:
   a PLL model configured to emulate an actual internal PLL signal, wherein the emulation is based on another internal PLL signal received from the digital PLL and on an estimated analog PLL parameter of the PLL model,
   wherein the digital PLL comprises a digital filter coupled between a phase difference digitizer and a digitally controlled oscillator (DCO), and the digital filter is configured to filter only a phase difference received from the phase difference digitizer; and
   a tracker configured to compare the emulated internal PLL signal with the actual internal PLL signal, and to update the estimated analog PLL parameter according to a minimization algorithm that minimizes a result of the comparison.

2. The tracking system of claim 1, wherein the PLL model comprises:
   a Digitally Controlled Oscillator (DCO) model configured to emulate, based on the other internal PLL signal and the estimated analog PLL parameter, the actual internal PLL signal in analog form; and
   a phase digitization model configured to emulate, based on the emulated internal PLL signal in analog form, the emulated internal PLL signal in digital form to be compared with the actual internal PLL signal.

3. The tracking system of claim 2:
   wherein the system comprises a plurality of estimated analog PLL parameters including estimated DCO gain, estimated DCO minimum frequency, and estimated phase digitization gain, the internal PLL signal is a DCO input control signal, and the actual internal PLL signal is a DCO phase signal,
   wherein the DCO model is configured to emulate a DCO phase signal in analog form based on the DCO input control signal, the estimated DCO gain, and the estimated DCO minimum frequency, and
   wherein the phase digitization model is configured to emulate the DCO phase signal in digital form based on the emulated DCO phase signal in analog form and the estimated phase digitization gain.

4. The tracking system of claim 1, wherein the PLL model is configured to emulate the actual internal PLL signal based on a plurality of estimated analog PLL parameters of the PLL model, at least one of the plurality of estimated analog PLL parameters being predetermined, and at least one of the plurality of estimated analog PLL parameters being updated continuously during tracking system operation.

5. The tracking system of claim 1, wherein the PLL model comprises a Digitally Controlled Oscillator (DCO) model comprising:
   a multiplier configured to multiply a DCO input control signal, which is the other internal PLL signal, with an estimated DCO gain, which is the estimated analog PLL parameter; and
   an adder configured to add the multiplication result to an estimated DCO minimum frequency, which is another estimated analog PLL parameter of the PLL model, and output an emulated DCO frequency signal.

6. The tracking system of claim 5, wherein the DCO model further comprises:
   a frequency-to-phase converter configured to convert the emulated DCO frequency signal into the emulated DCO phase signal in analog form.

7. The tracking system of claim 6, wherein the PLL model further comprises a phase digitization model comprising:
   a second multiplier configured to multiply the emulated DCO phase signal in analog form and an estimated phase digitization gain, which is yet another estimated analog PLL parameter of the PLL model, and output the emulated DCO phase signal in digital form, which is the emulated internal PLL signal to be compared with the actual internal PLL signal.

8. The tracking system of claim 1, wherein the estimated analog PLL parameter is Digitally Controlled Oscillator (DCO) gain.

9. The tracking system of claim 1, wherein the estimated analog PLL parameter is phase digitization gain.

10. The tracking system of claim 1, further comprising:
a calibrator configured to calibrate the digital PLL based on the estimated analog PLL parameter and a corresponding desired analog PLL parameter.

11. The tracking system of claim 1, further comprising:
a monitor or Built-In-Self-Test (BIST) configured to generate an alarm signal when the estimated analog PLL parameter is outside of a predetermined range.

12. The tracking system of claim 1, wherein the tracker comprises:
a subtractor configured to perform the comparison by subtracting the emulated internal PLL signal from the actual internal PLL signal, and to feed the subtraction result signal to the minimization algorithm.

13. The tracking system of claim 1, wherein the tracker comprises:
a cost function circuit configured to perform the comparison by determining a cost function based on the emulated internal PLL signal and the actual internal PLL signal, and to feed the determined cost function to the minimization algorithm.

14. The tracking system of claim 1, wherein the estimated PLL analog parameter is one or more of Digitally Controlled Oscillator (DCO) gain, DCO offset, phase digitization gain, phase digitization offset, Differential Nonlinearity (DNL) errors in a DCO, Integral Nonlinearity (INL) errors in the DCO, Differential Nonlinearity (DNL) errors in the phase digitization, Integral Nonlinearity (INL) errors in the phase digitization, and PLL bandwidth.

15. The tracking system of claim 1, wherein each of the PLL model, the tracker, and the other internal PLL signal is fully digital.

16. The tracking system of claim 1, wherein the minimization algorithm is a Least Mean Squares (LMS) algorithm, a Particle Swarm Optimization (PSO) algorithm, a Random Walk Optimization (RWO) algorithm, or an algorithm of scaling and accumulating a difference between the emulated PLL signal and the actual internal PLL signal.

17. A tracking system for a digital Phase Locked Loop (PLL), the tracking system comprising:
a PLL model comprising a first PLL model portion configured to emulate a first actual internal PLL signal, wherein the emulation is based on a first other internal PLL signal received from the digital PLL and on a first estimated analog PLL parameter of the PLL model,
wherein the digital PLL comprises a digital filter coupled between a phase difference digitizer and a digitally controlled oscillator (DCO), and the digital filter is configured to filter only a phase difference received from the phase difference digitizer; and
a tracker comprising:
a second PLL model portion configured to emulate a second actual internal signal based on a second other internal PLL signal received from the digital PLL and an inverted second estimated analog PLL parameter;
a comparator configured to compare the first emulated actual internal PLL signal with the second emulated actual internal PLL signal; and
a minimizer configured to minimize a result of the comparison, and update the first or second estimated analog PLL parameter based on the minimized result.

18. A tracking method for a digital Phase Locked Loop (PLL), the method comprising:
emulating, by a PLL model, an actual internal PLL signal, wherein the emulation is based on another internal PLL signal received from the digital PLL and on an estimated analog PLL parameter of the PLL model,
wherein the digital PLL comprises a digital filter coupled between a phase difference digitizer and a digitally controlled oscillator (DCO), and the digital filter is configured to filter only a phase difference received from the phase difference digitizer;
comparing, by a tracker, the emulated internal PLL signal with the actual internal PLL signal; and
updating, by the tracker, the estimated analog PLL parameter according to a minimization algorithm that minimizes a result of the comparison.

19. The tracking method of claim 18, wherein the emulating comprises:
emulating, by a Digitally Controlled Oscillator (DCO) model and based on the other internal PLL signal and the estimated analog PLL parameter, the actual internal PLL signal in analog form; and
emulating, by a phase digitization model and based on the emulated internal PLL signal in analog form, the emulated internal PLL signal in digital form to be compared with the actual internal PLL signal.

20. The tracking method of claim 19:
wherein there are a plurality of estimated analog PLL parameters including estimated DCO gain, estimated DCO minimum frequency, and estimated phase digitization gain, the internal PLL signal is a DCO input control signal, and the actual internal PLL signal is a DCO phase signal,
wherein the emulating by the DCO model comprises emulating a DCO phase signal in analog form based on the DCO input control signal, the estimated DCO gain, and the estimated DCO minimum frequency, and
wherein the emulating by the phase digitization model comprises emulating the DCO phase signal in digital form based on the emulated DCO phase signal in analog form and the estimated phase digitization gain.

* * * * *